US008282848B2

(12) United States Patent  (10) Patent No.: US 8,282,848 B2
Ohmoto et al.  (45) Date of Patent: Oct. 9, 2012

(54) PLASMA PROCESSING METHOD AND PLASMA PROCESSING APPARATUS

(75) Inventors: Yutaka Ohmoto, Hikari (JP); Mamoru Yakushiji, Shuunan (JP); Yutaka Kouzuma, Kudamatsu (JP); Ken Yoshioka, Hikari (JP); Tsunehiko Tsubone, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1028 days.

(21) Appl. No.: 12/073,048

(22) Filed: Feb. 28, 2008

(65) Prior Publication Data

US 2008/0280451 A1 Nov. 13, 2008

(30) Foreign Application Priority Data

Dec. 5, 2007 (JP) .................................. 2007-314133

(51) Int. Cl.
*G01L 21/30* (2006.01)
*G01R 31/00* (2006.01)
*C23F 1/00* (2006.01)
*H01L 21/306* (2006.01)

(52) U.S. Cl. .......................................... 216/59; 216/58
(58) Field of Classification Search ............... 156/345.28
See application file for complete search history.

(56) References Cited

U.S. PATENT DOCUMENTS

| 7,274,004 | B2 | 9/2007 | Benjamin et al. |
| 2005/0051100 | A1* | 3/2005 | Chiang et al. ............ 118/728 |
| 2005/0173403 | A1* | 8/2005 | Benjamin et al. .......... 219/444.1 |
| 2006/0283549 | A1* | 12/2006 | Aramaki et al. ........ 156/345.28 |

FOREIGN PATENT DOCUMENTS

JP 2004-533718 11/2004

\* cited by examiner

*Primary Examiner* — Shamim Ahmed
*Assistant Examiner* — Brandford Gates
(74) *Attorney, Agent, or Firm* — McDermott Will & Emery LLP (57) ABSTRACT

A plasma processing apparatus includes: a film which is made of an insulative material and constructs a surface of a sample stage on which a sample is put; a disk-shaped member whose upper surface is joined with the film in a lower portion of the film and which is made of a heat conductive member; heaters which are arranged in the film and arranged in a center portion and regions of its outer peripheral side of the film; coolant channels which are arranged in the disk-shaped member and in which a coolant for cooling the disk-shaped member flows; a plurality of power sources each of which adjusts an electric power to each of the heaters in the plurality of regions; and a controller which adjusts outputs from the plurality of power sources by using a result obtained by presuming a temperature of the upper surface of the disk-shaped member.

1 Claim, 6 Drawing Sheets

| ITEM | | STEP 1 | STEP 2 |
|---|---|---|---|
| GASES | $Cl_2$(ccm) | 80 | 70 |
| | HBr(ccm) | 20 | 30 |
| | $O_2$(ccm) | 5 | 2 |
| Press.(Pa) | | 0.5 | 0.5 |
| SOURCE (W) | | 800 | 800 |
| BIAS (W) | | 30 | 60 |
| SURFACE CONTROL TEMPERATURE | CENTER (°C) | 35 | 50 |
| | MIDDLE (°C) | 35 | 45 |
| | EDGE (°C) | 35 | 40 |

FIG.10

PLASMA PROCESSING METHOD AND PLASMA PROCESSING APPARATUS

BACKGROUND OF THE INVENTION

1. Field of the Invention

The invention relates to a plasma processing apparatus or a plasma processing method and, more particularly, to a plasma processing apparatus or a plasma processing method in which a film arranged on the surface of a sample as a processing target is processed by realizing conditions of different processes.

2. Description of the Related Art

In the case of using a plasma processing apparatus as mentioned above in order to manufacture a semiconductor apparatus such as a semiconductor device or the like, it is necessary that a film arranged on the surface of a substrate-like sample such as a semiconductor wafer having a disk shape of a processing target is processed at high precision. In recent years, in order to improve an integration degree of the semiconductor apparatus, processing conditions such as temperature distribution and the like regarding a radial direction and a circumferential direction of the sample are adjusted so as to have desired values. Particularly, in an etching process for processing the film on the surface of the semiconductor wafer by using a plasma formed in a processing room in a vacuum chamber in which the semiconductor wafer is arranged, the process is generally executed while a product formed in the plasma is deposited onto a side wall of a groove or hole structure formed by etching. Since a deposition degree of such a deposit is largely influenced by a temperature, a value of the temperature of the surface of the sample which is being processed and its distribution are significant conditions upon realizing the high precision process. Therefore, in order to precisely adjust the temperature of the surface of the sample during the processing of the sample, there has been known such an apparatus in the related art that a passage of a coolant is arranged in a sample stage (holder) where the sample is put on its upper surface or a gas having heat transfer performance is supplied into a space between the sample stage and the sample, and a pressure of the gas is properly adjusted, thereby maintaining the sample temperature within a range of proper values.

In recent years, a microfabrication of a device structure is being progressed in association with an increase in integration degree of a semiconductor integrated circuit and, in many cases, the device constructed by a single layer film in the related art is formed as a laminate layer in a plurality of film kinds in accordance with a requirement for improvement of characteristics. For example, in wirings, as for a wiring material constructed by an aluminum single layer in the related, such a technique that an upper layer film and a lower layer film of the wiring material are made of, for example, titanium nitride and laminated for the purpose of satisfying requirements for improvement of reliability and high exposure resolution is widely used. Further, in recent years, the laminate structure is also used for a gate electrode in order to satisfy requirements for a high speed of a transistor and a low electric power consumption. In order to realize such a fine structure of the semiconductor device, such a technique that processes are continuously executed to a structure of a plurality of films laminated on the surface of the semiconductor wafer while making processing conditions different according to each film or that one film is continuously processed under a plurality of different conditions is used. According to such processes, in order to increase the number of samples to be processed per unit time, it is desirable to change the processing conditions while keeping the samples on the sample stage in the processing room. However, if a long time is expended for such a change in processing conditions as mentioned above, processing efficiency (throughput) deteriorates.

According to the technique for circulating the coolant in the passage arranged in the sample stage, it takes a longer time to change the temperature of the sample stage than that in the case of changing a pressure of the gas having the heat transfer performance because of a magnitude of a heat capacity of the coolant. Therefore, if it is intended to change the temperature value and its distribution for a period of time between the foregoing processes which are continuously executed, the throughput deteriorates. According to the technique for changing the pressure of the heat transfer performance gas (for example, He or the like), although the pressure change and a change in heat transfer coefficient between the sample and the sample stage due to the pressure change can be realized in a relatively short time, the temperature change of the sample due to the change in heat transfer coefficient can be performed only in the case where the heat from the plasma formed in the space over the sample stage in the processing room is supplied to the sample and transferred to the sample stage, that is, only in the case where the heat transfer through the sample has occurred between the plasma and the sample stage. There are consequently the following problems the above technique cannot be applied to such a process that the plasma is extinguished for a period of time of the change in processing conditions mentioned above. Characteristics such as a speed and the like of the processes at the initial stage where the plasma was formed differ from characteristics of the processes in a state where the plasma is stabilized after that, so that the processing precision is deteriorated.

To solve such problems, there is such a technique that a heating device such as a heater or the like is arranged in the sample stage and the value of the sample temperature or its distribution is adjusted by heating the sample stage by the heater (further, a cooling process by a flow of the coolant in the sample stage may be also used). As such a related art, the method disclosed in JP-T-2004-533718 (published Japanese translation of a PCT appln.) corresponding to U.S. Pat. No. 7,274,004 etc. has been known. According to such a related art, the heater is built in an electrode made of a conductive material (metal) in the sample stage and an electric power which is supplied to the heater is controlled on the basis of an output value detected by a temperature sensor embedded near the heater, so that temperature distribution in the sample stage is adjusted, thereby indirectly adjusting a wafer temperature so as to obtain desired value and distribution.

SUMMARY OF THE INVENTION

In the case of continuously processing the foregoing film structure by etching, if the temperatures as processing conditions of the films are identical, the material of each film reacts to a process gas for etching, vapor pressures of reaction products (on the sample surface) formed in the processing room differ, deposit amounts of protective films on the side wall differ, and precision of a shape which is obtained by the processes deteriorates. Therefore, it is desirable to change the sample temperature at the time of the etching of each layer. Particularly, in the gate electrode process in which a gate length that is decided by the etching process directly exerts an influence on electric characteristics of a transistor, high precision is demanded in the temperature control. Further, when changing the wafer temperature every etching of each layer, it is demanded to change the temperature at a high speed and reduce a waiting time as much as possible in order to raise productivity.

As for such problems, in the related art, since a detecting position of the temperature sensor arranged in the sample stage (electrode) is away from the position of the surface of the electrode, if the electric power of the heater was controlled based on a detection signal of the sensor, there is a case where the wafer temperature oscillates and it exercises an adverse influence on the etching shape. This is because the sample temperature changes in an oscillation manner for a little while until the sample temperature is settled after it reached a preset temperature and it takes a long time until the process becomes stable. Nothing is considered with respect to the following point. That is, since the temperature sensor is arranged in the electrode at an intermediate position between the heater and the channel of the coolant and exists at a position where a gradient of the temperature between them is large, there are large spatial and time-dependent differences between the detected temperature and the actual temperature of the sample surface and this results in a deterioration of the processing precision.

In the case where the sample temperature is adjusted based on a signal obtained by detecting the sample temperature or its estimation value, there is such a problem that if it is intended to directly detect the sample temperature, the sensor becomes expensive and, further, the reliability is low. Further, in the case of presuming a temperature difference by the insertion heat supplied from the plasma, it is necessary to precisely presume an amount and a speed of the insertion heat which is transferred from the plasma to the wafer. However, since the reliability of a detecting device such as a temperature sensor or the like necessary to detect an amount of insertion heat is low, many experiments are preliminarily necessary in order to accurately decide the amount regarding the insertion heat. Since the sample temperature also differs in dependence on the processing conditions such as temperature value and the like, it is difficult to obtain the result with the high reliability. Thus, with respect to a point that the processing efficiency deteriorates, nothing is considered in the foregoing related arts.

It is an object of the invention to provide a plasma processing apparatus or a plasma processing method, in which distribution of a temperature of a sample or a sample stage is precisely realized in a short time and processing efficiency is improved.

The above object is accomplished by a plasma processing apparatus for processing a sample stage arranged in a processing room in a vacuum chamber and a sample put on the sample stage by using a plasma formed in the processing room, comprising: a film which is made of an insulative material and constructs a surface of the sample stage on which the sample is put; a disk-shaped member whose upper surface is joined with the film in a lower portion of the film and which is made of a heat conductive member; heaters which are arranged in the film and arranged in a center portion and regions of its outer peripheral side of the film; coolant channels which are arranged in the disk-shaped member and in which a coolant for cooling the disk-shaped member flows; a plurality of power sources each of which adjusts an electric power to each of the heaters in the plurality of regions; and a controller which adjusts outputs from the plurality of power sources by using a result obtained by presuming a temperature of the upper surface of the disk-shaped member.

The above object is accomplished by the plasma processing apparatus further comprising: temperature sensors which are arranged between the upper surface of the disk-shaped member and the coolant channels and detect temperatures of portions of the disk-shaped member in lower portions of the plurality of regions in correspondence to those regions; and the controller which adjusts the outputs from the power sources by using a result obtained by presuming the temperature of each of the regions of the upper surface of the disk-shaped member by using signals of outputs from the temperature sensors.

The above object is accomplished by a plasma processing method of putting a sample onto a sample stage arranged in a processing room in a vacuum chamber, forming a plasma in the processing room, and processing the sample by using the plasma, wherein the sample stage has: a film which is made of an insulative material and constructs a surface on which the sample is put; a disk-shaped member which is made of a heat conductive member and, in a lower portion of the film, whose upper surface is joined with the film; heaters which are arranged in the film and arranged in a center portion and regions of its outer peripheral side of the film; coolant channels which are arranged in the disk-shaped member and in which a coolant for cooling the disk-shaped member flows; and a plurality of power sources each of which adjusts an electric power to each of the heaters in the plurality of regions, and the sample is processed by adjusting outputs from the plurality of power sources by using a result obtained by presuming a temperature of an upper surface of the disk-shaped member.

Further, the above object is accomplished by the plasma processing method, wherein the sample stage further has temperature sensors which are arranged between the upper surface of the disk-shaped member and the coolant channels and detect temperatures of portions of the disk-shaped member in lower portions of the plurality of regions in correspondence to those regions, and the sample is processed by adjusting the outputs from the power sources by using the result obtained by presuming the temperature of each of the regions of the upper surface of the disk-shaped member by using signals of outputs from the temperature sensors.

Furthermore, the above object is accomplished by the plasma processing method, wherein by using the result obtained by presuming the temperature of the upper surface of the disk-shaped member in a lower portion of one of the regions by using the output of the temperature sensor arranged under such a region and the outputs from the temperature sensors arranged under the regions adjacent to such a region, the controller adjusts the output from the power source for supplying an electric power to such a region. Moreover, the above object is accomplished by the plasma processing method, wherein by using the result obtained by presuming by using the output of the temperature sensor arranged under such a region and the value of the electric power supplied to the heater arranged in such a region, the controller adjusts the output from the power source for supplying an electric power to such a region.

Other objects, features and advantages of the invention will become apparent from the following description of the embodiments of the invention taken in conjunction with the accompanying drawings.

DETAILED DESCRIPTION OF THE EMBODIMENTS

Embodiments of the invention will be described hereinbelow with reference to the drawings.

[Embodiment 1]

The embodiments of the invention will be described with reference to FIGS. 1 to 10.

Figure 1:
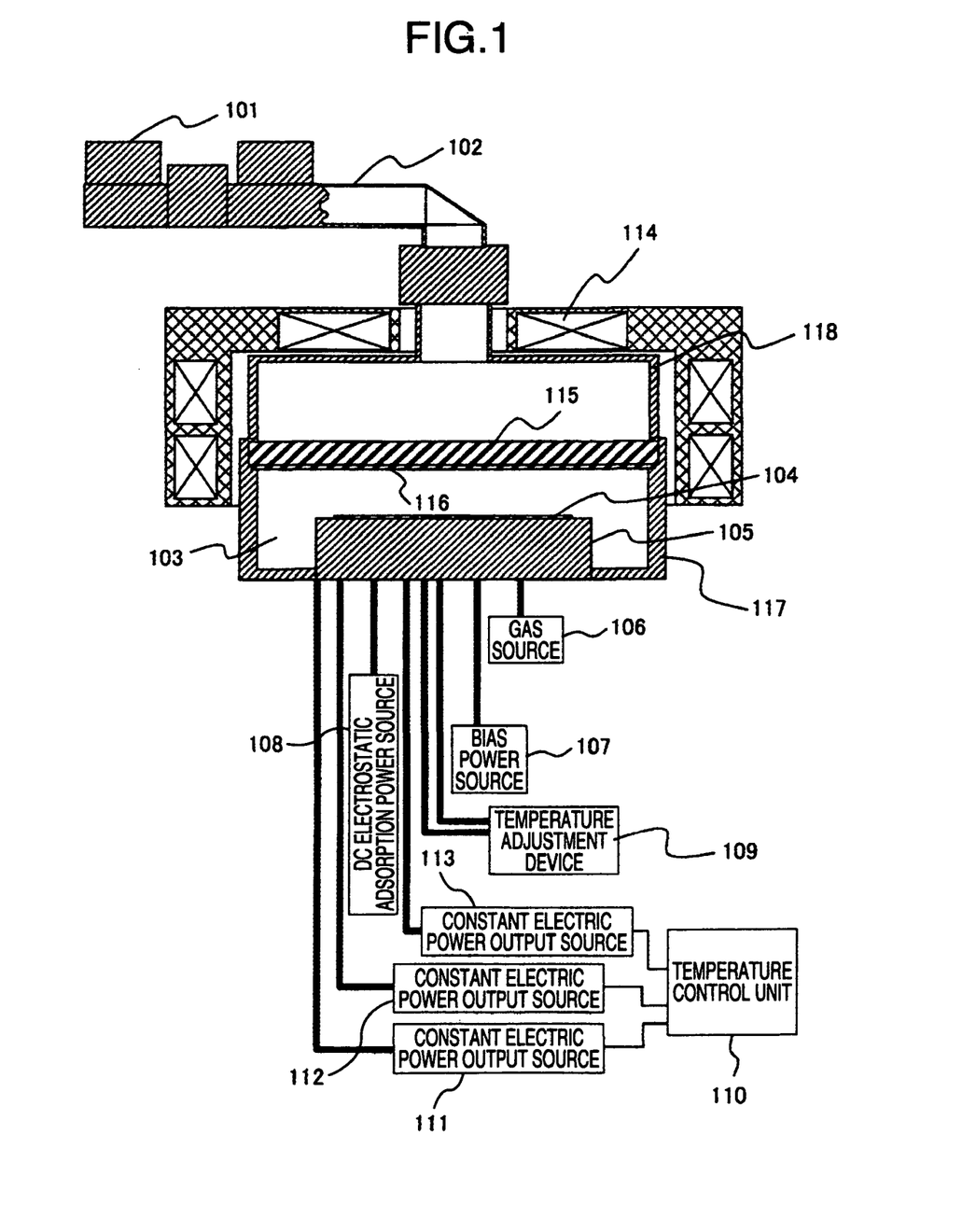
FIG. 1 is a vertical sectional view schematically illustrating an outline of a construction of a plasma processing apparatus according to the invention.

A plasma processing apparatus according to the embodiment of the invention will be described with reference to FIG. 1. FIG. 1 is a vertical sectional view schematically illustrating an outline of a construction of the plasma processing apparatus according to the invention.

In FIG. 1, according to the plasma processing apparatus of the invention, a sample as a processing target such as a semiconductor wafer or the like put on a sample stage (holder) 105 having an electrode therein arranged in a lower portion in a processing room 103 is etching-processed by using a vacuum chamber 117 and a plasma formed by supplying an electric field or a magnetic field into the processing room 103 arranged in the vacuum chamber 117. A waveguide 102 in which the electric field that is supplied into the processing room 103 is propagated and a microwave source 101 such as a magnetron or the like serving as a radio source arranged in a front edge portion of the waveguide 102 are arranged over the vacuum chamber 117.

A microwave outputted from the microwave source 101 is propagated in the waveguide 102 and transmitted toward the vacuum chamber 117 side. First, the waveguide 102 is arranged so as to be extended from the microwave source 101 from the left to the right in the diagram and, thereafter, bent toward an upper portion of the lower vacuum chamber 117. The propagating direction of the microwave that is propagated in the waveguide 102 is bent downward from the right in the diagram in accordance with the bending of the waveguide 102. After that, the microwave is introduced into a space in a resonance vessel 118 coupled with a lower edge of the waveguide 102.

The resonance vessel 118 has an almost cylindrical shape with a shape whose inside is substantially axially symmetrical around the same center axis as that of the processing room 103. A disk-shaped window member 115 made of quartz for airtightly sealing the inside of the processing room 103 is arranged on a bottom surface of the resonance vessel 118. The window member 115 constructs a part of the vacuum chamber 117 and functions as a ceiling of the processing room 103. The microwave which has resonated and is oscillated in a cylindrical room in the resonance vessel 118 is transmitted through the window member 115 of the bottom surface and a disk-shaped shower plate 116 arranged under the window member 115. The shower plate 116 constructs a ceiling surface of the processing room 103. The transmitted microwave is introduced from an upper portion of the processing room 103 toward the sample put on the sample stage 105 so as to face the lower surface of the shower plate 116 almost in parallel therewith.

At least one kind of process gases is supplied into the processing room 103 from a plurality of through-holes formed around the center arranged in accordance with a center axis of the processing room 103 of the shower plate 116. The introduced process gas is excited by the electric field caused by the microwave supplied into the processing room 103 and the magnetic field supplied into the processing room 103 from solenoid coils 114 arranged over and in a side periphery of the resonance vessel 118 and in a side periphery of the vacuum chamber 117. Thus, the plasma is formed in the processing room 103. A vacuum evacuating system (not shown) coupled with a lower portion of the vacuum chamber 117 and a gas introducing system (not shown) coupled with the vacuum chamber 117 in an upper portion of the processing room 103 are coupled with the processing room 103. By the operations of those systems, the space in the processing room 103 is held at an atmosphere and a pressure which are suitable for processes.

That is, while the inside of the processing room 103 is adjusted so as to become a pressure suitable for the processes owing to an interaction between such an action that the microwave and the process gas are introduced from the upper portion into the processing room 103 and such an action that the gas in the processing room 103 is exhausted from the periphery of the sample stage 105 and from the lower portion of the processing room 103, the plasma formed by using the process gas can execute a predetermined process to a sample to be processed (hereinbelow, referred to as a wafer) 104. As plasma forming means, inductive coupling means using a radio frequency or electrostatic coupling means using a radio frequency instead of the microwave may be used.

The wafer 104 is put on the cylindrical sample stage 105 arranged in accordance with the center axis of the almost cylindrical processing room 103. A disk-shaped electrode made by a conductive member connected to a bias power source 107 is arranged in the sample stage 105. By an electric power from the bias power source 107, a bias electric potential is applied to the surface of the wafer 104 put on a film made of a dielectric material constructing the almost circular sample stage surface of the upper surface of the sample stage 105. Thus, ions in the plasma are pulled into the upper surface of the wafer 104, the etching in the depth direction is promoted, and working precision can be improved.

Further, the following component elements are connected through respective connecting paths between the sample stage surface of the sample stage 105 and the back surface of the wafer 104 put thereon: a gas source 106 of a heat transfer gas such as He or the like for improving a heat conduction between the sample and a dielectric material film constructing the sample stage surface; a DC (direct current) electrostatic adsorption power source 108 for supplying an electric power to an electrostatic chuck for adsorption holding the wafer 104 onto the dielectric material film by static electricity; constant electric power output sources 111, 112, and 113 which are used for adjustment of a temperature of the wafer 104 by the operation of heaters, which will be explained hereinafter, arranged in the dielectric material film; and further, a temperature adjustment device 109 for circulating a coolant, while adjusting a temperature of the coolant, which flows in a coolant channel arranged in a base material in order to adjust the sample stage 105 to a predetermined temperature by cooling the base material constructing a disk-shaped electrode made of a conductive material in the sample stage 105. A temperature control unit 110 for adjusting values of output powers is coupled with the constant electric power output sources 111, 112, and 113. The heating operations of the constant electric power output sources 111, 112, and 113 are controlled by instructions which are generated from the temperature control unit 110, so that the temperature of the wafer 104 is adjusted to a desired value.

In the plasma processing apparatus shown in FIG. 1, in a state where while an inert gas such as Ar or the like is introduced into the processing room 103, it is exhausted by a vacuum evacuating system (not shown) and the inside of the processing room 103 has been adjusted to a predetermined pressure, the wafer 104 is put onto an arm of a robot for conveyance (not shown) and conveyed and, subsequently, put onto the sample stage surface on the sample stage 105. After that, the electric power for electrostatic adsorption, which will be explained hereinafter, is supplied and the gas having heat transfer performance from the gas source 106 is supplied between the wafer 104 which has been adsorption held onto the sample stage surface.

Further, a process gas obtained by mixing gases of a plurality of substances serving as predetermined compositions suitable for the processes of the target film is supplied into the processing room 103 from the through-holes of the shower plate 116. Processing conditions such as value of the temperature of the wafer 104, its distribution, and the like are set on the basis of processing conditions included in data which has previously been obtained by the plasma processing apparatus. In the embodiment, the value of the temperature of the wafer 104 and its distribution are realized by an interaction or balance of both of the cooling that is performed by the temperature-adjusted coolant which is supplied into the sample stage 105 and the heating that is performed by the heater arranged in an upper portion of the sample stage 105, which will be explained hereinafter.

The microwave is supplied into the processing room 103 from the window member 115 over the shower plate 116. The magnetic field is supplied into the processing room 103 from the solenoid coils 114. The inside of the processing room 103 is set to a predetermined pressure suitable for creation of the plasma. The process gas is excited by properly adjusting intensities of the electric field and the magnetic field, so that the plasma is formed. Charged particles in the plasma are pulled into the surface of the wafer 104 by an attraction caused by a potential difference between the bias electric potential of the surface of the wafer 104 formed by the electric power from the bias power source 107 and the plasma. The etching process of the film on the surface of the wafer 104 is started.

When the etching process of the target film is progressed and it is detected by a detecting apparatus (not shown) for discrimination of an end point that the etching process has reached a predetermined end point, the plasma is extinguished. The compositions of the process gas suitable for the process of the lower portion of the film and the processing conditions such as value of the temperature of the wafer 104, its distribution, and the like are changed. After that, the process gas having new compositions is supplied into the processing room 103 and an electric field and a magnetic field are supplied, thereby forming a plasma. A bias electric power is applied and the process of the lower film portion is started.

After the above processes were executed until the end of a predetermined process, the plasma is extinguished. The supply of the bias electric power and, further, the heat transfer gas from a gas source is stopped. The electric power from the electrostatic adsorption power source 108 is stopped. In this instance, the supply of the electric powers from the constant electric power output sources 111, 112, and 113 to the heaters is stopped as necessary. After that, the wafer 104 is lifted upward to a position over the sample stage 105 and conveyed to the outside of the processing room 103 by the conveying robot. Another wafer 104 is again conveyed into the processing room 103 and put onto the sample stage 105 and the processes using the plasma are executed.

Figure 2:
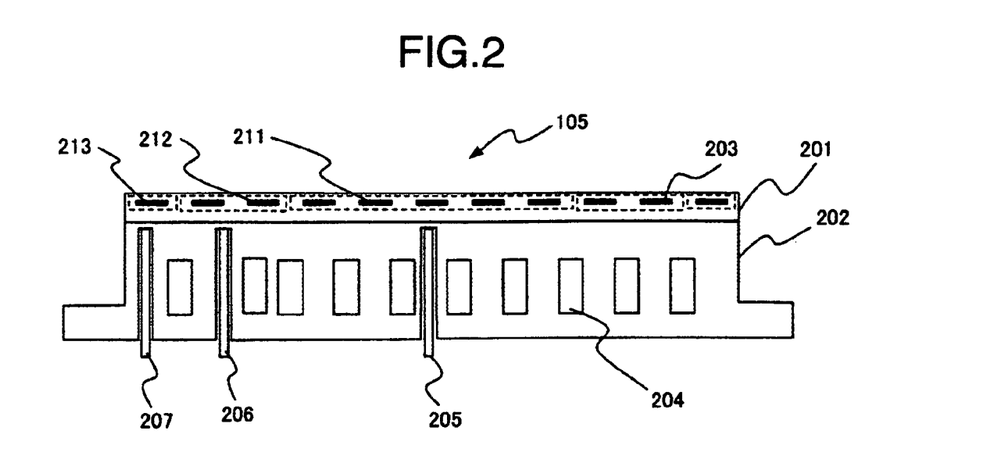
FIG. 2 is a vertical sectional view schematically illustrating an outline of a construction of a sample stage (holder) having an electrode therein in an embodiment illustrated in FIG. 1.

A construction of the sample stage 105 shown in FIG. 1 will be described in more detail with reference to FIG. 2. FIG. 2 is a vertical sectional view schematically illustrating an outline of the construction of the sample stage (holder) having the electrode therein in the embodiment illustrated in FIG. 1. In the diagram, a main portion of the upper portion of the sample stage 105 is schematically illustrated. The upper portion of the sample stage 105 mainly has: a head plate 201; and a cooling plate 202 which is joined therewith and arranged under the head plate 201.

The head plate 201 is a film-like member having a disk shape and made of an insulative material and constructs the sample stage surface. Heater resistors 203 for heating are embedded in the head plate 201 so as to exist in the whole sample stage surface. Each of the heater resistors 203 is made of a film-like metal film having a predetermined width. In the embodiment, the heater resistors 203 are arranged in such a manner that multiple arcs are constructed around the center so as to be almost axially symmetrical around the center of the sample stage surface.

The heater resistors 203 belong to three regions each surrounded by a rectangle which is shown by a broken line in the diagram and constructs a multiple arc. Those regions form a center region 211, a middle region 212, and an edge region 213 from the center portion. The three independent constant electric power output sources 111, 112, and 113 are connected to the heater resistors 203 in those regions, respectively. Internal channels 204 serving as multiple concentrical passages for circulating the coolant whose temperature has been adjusted by the temperature adjustment device 109 in FIG. 1 are arranged in the cooling plate 202. The internal channels 204 are arranged around the axis that is concentric with the center of the sample stage surface so as to exist in the whole sample stage surface, and set fundamental distribution of the temperature of the cooling plate 202 in the plane direction of the wafer 104.

The heater resistor 203 in the embodiment is constructed as an integrated film by the following method. A material containing film-like tungsten of an insulative material constructed by ceramics such as alumina or the like formed until a predetermined thickness onto an upper surface of a convex portion of the cooling plate 202 as a disk having a cross sectional convex shape made of a metal having a high heat conductivity such as aluminum is sprayed into a region of a predetermined shape, thereby forming a plate. After that, the insulative material is further formed on an upper portion of the plate, thereby forming the integrated film. The lower surface of the head plate 201 and the upper surface of the cooling plate 202 are joined as if they were an integrated member. The cooling plate 202 has therein means for adjusting the temperature of the sample put on the head plate 201, is a member constructing the main portion of the upper portion of the sample stage 105, and can be called a base material which fundamentally sets the temperature of the sample.

The region, where the heating of the head plate 201 in the embodiment is adjusted, has the center region 211 as an almost circular region which is concentric with the center of the sample stage surface and the middle region 212 and edge region 213 as double regions having a ring shape which have concentrically arranged on the outer peripheral side of the center region 211. Holes of a small diameter having front edge surfaces each of which is extended in the vertical direction and is away from an upper surface of a convex portion by a predetermined distance are formed in positions of the cooling plate 202 in the different radial directions from the same center as that of the sample stage 105. Rod-shaped temperature sensors 205, 206, and 207 are inserted into the holes and their positions are fixed to the cooling plate 202. Resistance temperature detectors are used as temperature sensors 205, 206, and 207 in the embodiment. A detecting portion of each edge is arranged at a height position between upper surfaces of the internal channels 204 and the upper surface of the convex portion.

The above holes are located under the center region 211, middle region 212, and edge region 213. Particularly, the temperature sensor 205 is arranged just under the center of the center region 211 including the center of the head plate 201. The temperature sensor 207 is arranged in a projecting surface covered by the heater resistor 203 in the edge region 213 on the outer peripheral side of the outermost channel of the internal channels 204, that is, it is arranged just under the edge region 213. Each of the temperature sensors 205, 206, and 207 detects a temperature of the portion between the internal channel 204 of the cooling plate 202 which changes as a result of the heating by the heater resistor 203 in each region and the upper surface of the convex portion.

Figure 3:
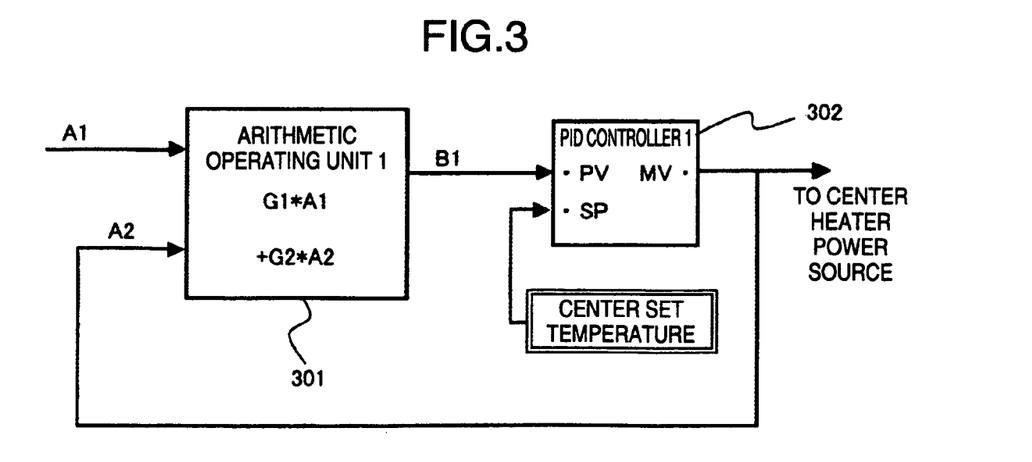
FIG. 3 is a block diagram schematically illustrating a construction in a temperature control unit 110 shown in FIG. 1.
Figure 4:
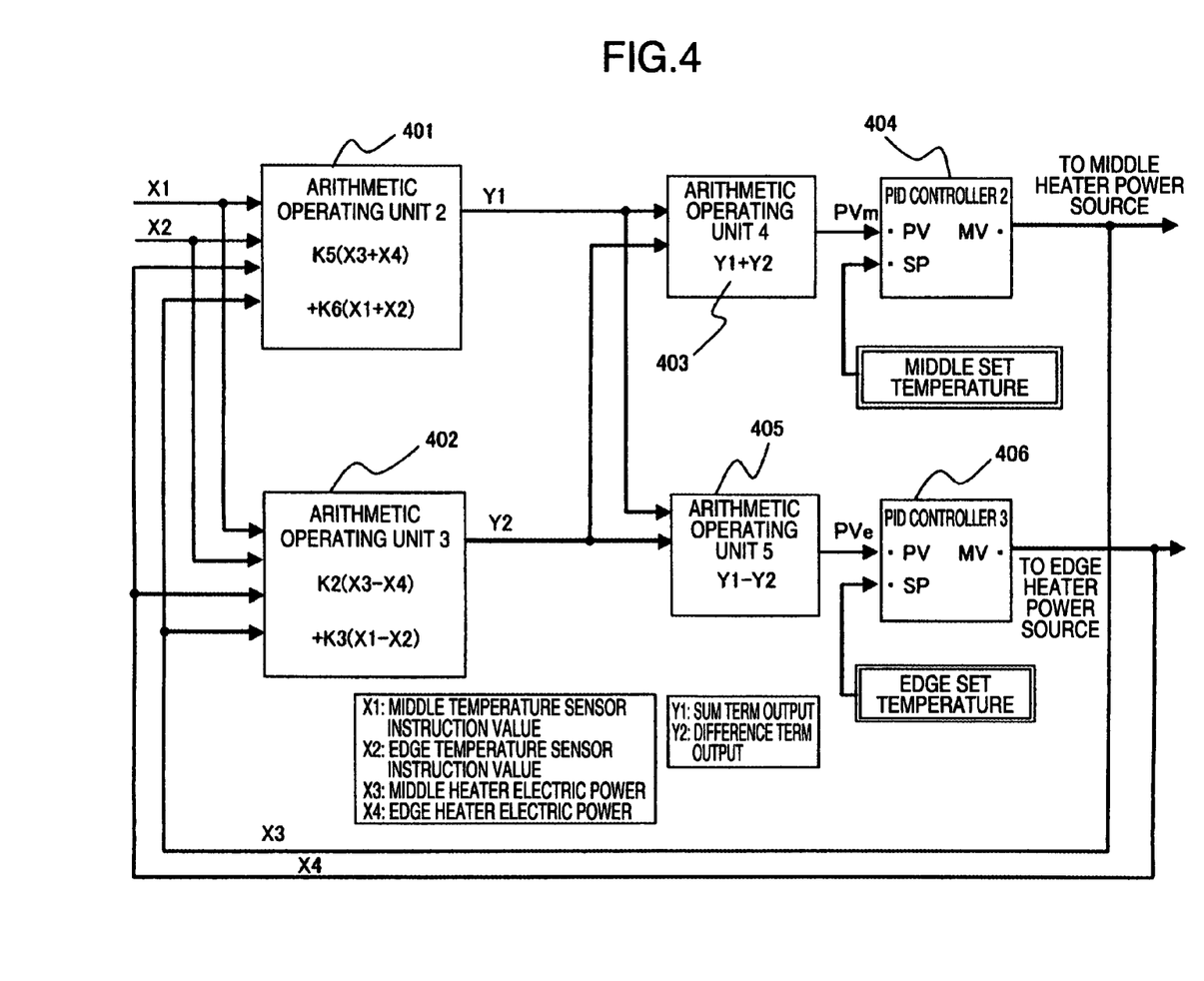
FIG. 4 is a block diagram schematically illustrating a construction in the temperature control unit 110 shown in FIG. 1.

FIGS. 3 and 4 are block diagrams schematically illustrating a construction in the temperature control unit 110 shown in FIG. 1. FIG. 3 shows the construction regarding the center region 211. FIG. 4 shows the construction regarding the middle region 212 and the edge region 213. As shown in FIG. 3, in the temperature control unit 110 in the embodiment, a signal Al as an output from the temperature sensor 205 in the center region 211 and an electric power instruction value A2 to the constant electric power output source 111 as a heater power source are inputted to an arithmetic operating unit 1 (301). In the arithmetic operating unit 1 (301), a value obtained by multiplying the signal value Al from the temperature sensor 205 by a predetermined coefficient G1 and a value obtained by multiplying the electric power instruction value A2 to the heater power source by a predetermined coefficient G2 are added and an addition value is outputted as B1. The output value B1 is inputted to a present value input PVc of a PID controller 1 (302) and compared with the set temperature of the upper surface of the convex portion of the cooling plate in the center region 211. An operation value MVc is outputted from the temperature control unit 110 so as to minimize a difference between them. The output operation value is a value which is outputted to the heater resistor 203 arranged in the center region 211. The operation of the constant electric power output source 111 as a heater power source corresponding to the center region 211 is adjusted so that the output operation value becomes an output corresponding to such a value.

As shown in FIG. 4, electric power instruction values X3 and X4 of the constant electric power output sources 112 and 113 as heater power sources corresponding to signals X1 and X2 outputted from the temperature sensors 206 and 207 corresponding to the middle region 212 and the edge region 213 are inputted to arithmetic operating units 2 (401) and 3 (402), respectively. In the arithmetic operating unit 2 (401), a value obtained by multiplying a sum of the signal values from the temperature sensors by a predetermined coefficient K6 and a value obtained by multiplying a sum of the electric powers by a predetermined coefficient K5 are added and an addition value is outputted as Y1. In the arithmetic operating unit 3 (402), a value obtained by multiplying a difference between the signal values as outputs from the temperature sensors 206 and 207 by a predetermined coefficient K3 and a value obtained by multiplying a difference between the instruction values to the two corresponding constant electric power output sources by a predetermined coefficient K2 are added and an addition value is outputted as Y2.

In an arithmetic operating unit 4 (403), Y1 and Y2 are added and a present value PVm of an instruction of a PID controller 2 (404) for adjusting the temperature of the middle region 212 is outputted. In an arithmetic operating unit 5 (405), a difference between Y1 and Y2 is calculated and a present value PVe of an instruction of a PID controller 3 (406) for adjusting the temperature of the edge region 213 is outputted. In each PID controller, each set temperature is compared with the present value and an operation value MV is outputted as a heater electric power value so as to minimize a difference between them. The heater resistor 203 belonging to each region is made operative by this electric power, the head plate 201 is heated, and the value of the temperature at each position of the surface of the wafer 104 and its distribution are adjusted to as to obtain desired value.

In the embodiment, the six constants which are used in the arithmetic operations of the arithmetic operating units mentioned above are obtained by preliminarily executing calibration tests using a wafer for temperature adjustment. In the calibration tests, each PID controller is not made operative but a specific predetermined electric power is supplied from each constant electric power output source to each heater resistor 203 so as to be made operative. By using the value obtained when the temperature has been saturated and the outputs from the temperature sensors 205, 206, and 207 in this instance, the temperature is detected by a temperature sensor for detecting temperatures of predetermined positions of the temperature measuring wafer corresponding to the positions of the temperature sensors 205, 206, and 207. It is considered that, when a time necessary for saturation elapses, the output of the temperature sensor for detecting the temperatures of the wafer surface and the output of the temperature sensors 205, 206, and 207 in the cooling plate 202 are stable. The detected temperatures of the sensor for the temperature measuring wafer are substituted into PVc, PVm, and PVe, respectively. By repetitively executing the above measurement by a combination of some of the heater outputs, the six constants are obtained by a method of least squares by using a plurality of obtained results.

By such arithmetic operations as mentioned above, in the temperature control unit 110 in the embodiment, the temperature of the portion corresponding to each of the center region 211, middle region 212, and edge region 213 on the surface of the convex portion of the cooling plate 202 is presumed and detected. In the embodiment, by adjusting the output of the electric power which is supplied to the heater resistor 203 in each region by using the estimation value of the temperature of the surface of the cooling plate 202 obtained by the above arithmetic operations, the temperature of the wafer 104 and its value are adjusted so as to lie within a desired range. Since the positions where the detecting portions of the temperature sensors 205, 206, and 207 are arranged are away from the upper surface of the convex portion of the cooling plate 202 (bottom surface of the head plate 201), the temperature can be adjusted at high precision as compared with the construction in which the operation of the heater resistor 203 in each region is adjusted by using the detection values regarding the temperatures detected at those positions.

Particularly, it is possible to provide the plasma etching apparatus in which the reproducibility and yield are improved by solving the following problem. That is, if the detecting portions of the temperature sensors 205, 206, and 207 are arranged at the positions away from the heater resistors 203 by the distances where such an adverse influence that the output values of the temperature sensors 205, 206, and 207 become unstable and the precision deteriorates by an impact of the heat accompanied with a fluctuation of the heating amounts of the heater resistors 203 can be suppressed as much as possible, the spatial and time-dependent differences between the actual temperature of the wafer 104 and the surface temperature of the head plate 201 increase, so that the precision deteriorates remarkably. Further, according to the embodiment, upon estimation of the temperature of the upper surface of the cooling plate 202, the actual temperature of the wafer 104 and the value of a quantity of the heat which is transferred from the plasma to the wafer 104 are not used, and the apparatus with low costs and the high reliability can be realized although the obtainment of a number of data for a long time and an experience are necessary in order to realize the precise detection of the temperature of the wafer 104 in the construction in which the temperature of the wafer 104 is presumed and the operation of the heater resistor 203 is adjusted by using those values.

With respect to the center region 211, since an area (length) of the surface which faces a boundary between the center region 211 and the middle region 212 is small, a mutual interference between them is small. The signals from the temperature sensors 205 and 106 and the values of the electric powers which are supplied to the heater resistors 203 are not mutually referred to between the middle region 212 and the center region 211. However, if such an interference cannot be ignored due to an increase in diameter of the wafer 104, they may be mutually referred to. With respect to the middle region 212 and the edge region 213, control can be also made by using only the signal of its own region without similarly mutually referring to the signals of the adjacent regions.

Figure 5:
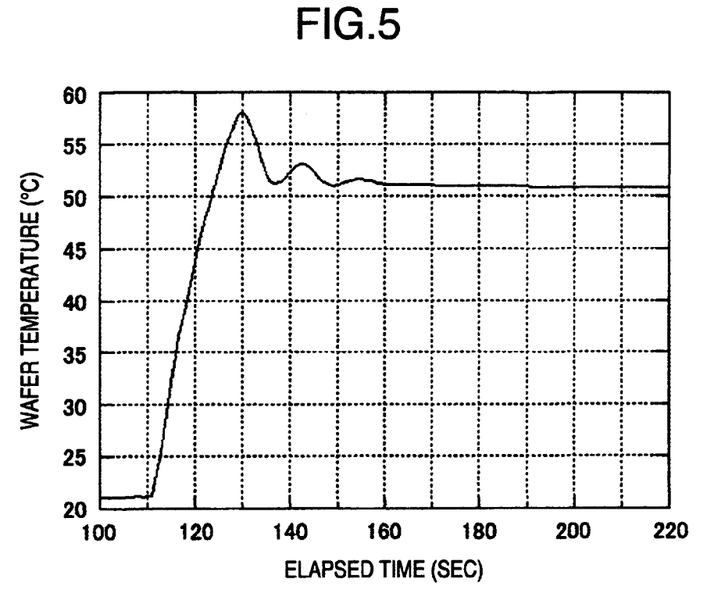
FIG. 5 is a graph showing an aging change of a temperature of a wafer in the case where the wafer temperature has been adjusted by a technique in the related art.

Subsequently, effects of the invention will be described with reference to FIGS. 5 and 6. FIG. 5 shows a change due to a time change of the temperature of the wafer (that is, a time-waveform) in the case where the signals from the temperature sensors are directly inputted as PV values of the PID controllers to the power sources for the heaters and the set value of the temperature is changed step by step without using the foregoing arithmetic operations according to the embodiment. As shown in the diagrams, according to the related art, the wafer temperature changes in an oscillating manner for a little while after the wafer temperature reached the set temperature, and it takes a long time until the settlement. The inventors et al. have obtained such knowledge that it is because the temperature sensor is located at an intermediate position between the heater and the upper end of the internal channel and exists at the position where a gradient of the temperature is large, there are large spatial and time-dependent differences between the actual temperature of the wafer and the surface temperature of the head plate and such a deterioration in control precision is caused.

Figure 6:
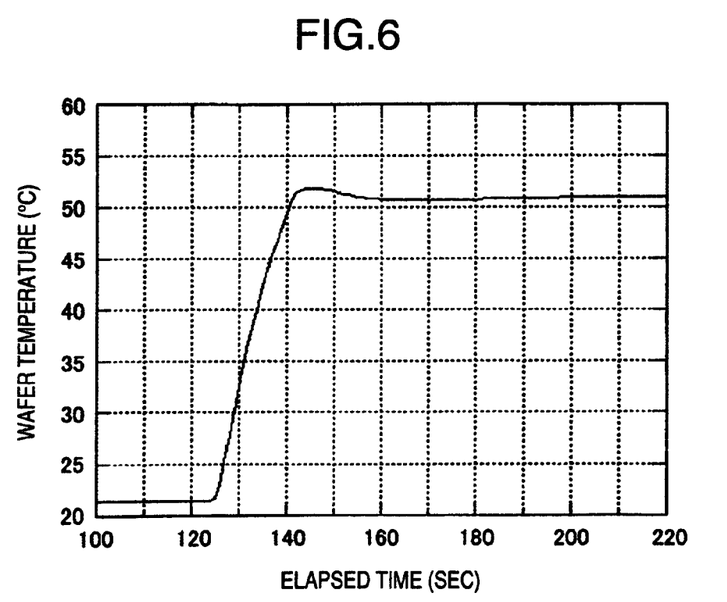
FIG. 6 is a graph showing an aging change of the temperature of the wafer in the case where the wafer temperature has been adjusted by the sample stage (holder) having the electrode therein of the plasma processing apparatus according to the embodiment shown in FIG. 1.

FIG. 6 is a graph showing an aging change of the temperature of the wafer in the case where the wafer temperature has been adjusted by the sample stage (holder) having the electrode therein of the plasma processing apparatus according to the embodiment shown in FIG. 1. As shown in the diagram, when the operation of the heater resistors 203 is adjusted by using the above arithmetic operations according to the embodiment, unlike the result shown in FIG. 5, the oscillation obtained after the wafer temperature reached the target temperature is small and the temperature can be settled in a short time. This is because the time-dependent and spatial differences between the positions of the detecting portions of the temperature sensors 205, 206, and 207 of the sample stage 105 shown in FIG. 2 and the surface of the wafer 104 have been compensated by the above arithmetic operations. Even in the case of attaching the heater resistors 203 at positions near the wafer 104 on the head plate 201 or the like as shown in the embodiment, the desired temperature value of the wafer 104 and its distribution can be achieved by adjusting the operation of the heaters at high precision.

In the related art, if it is intended to solve the foregoing problem of the precision deterioration by allowing the positions of the detecting portions of the temperature sensors to be close to the wafer, there occurs such a problem that thermal characteristics around the sensors differ from those of other locations and uniformity of the wafer temperature is deteriorated due to an interference between the layout of the heaters in the head plate 201 and the arranging positions of the temperature sensors and an influence of the holes formed to attach the temperature sensors. By using the invention, since the temperature sensors 205, 206, and 207 and the holes into which they are inserted can be arranged at the positions and depths where the temperature uniformity of the surface of the wafer 104 is not influenced, an adverse influence which is exerted on the temperature uniformity of the wafer 104 is suppressed and the detecting precision of the temperature and the processing uniformity can be improved.

The same gain is used in the comparison arithmetic operation of both of them and the vibration-like change of the wafer temperature can be suppressed by reducing the gain with respect to the former case. However, in such a case, it takes a long time to raise the temperature, so that a time which is required for settlement until it can be regarded that no adverse influence is exerted on the processes cannot be reduced.

Figure 7:
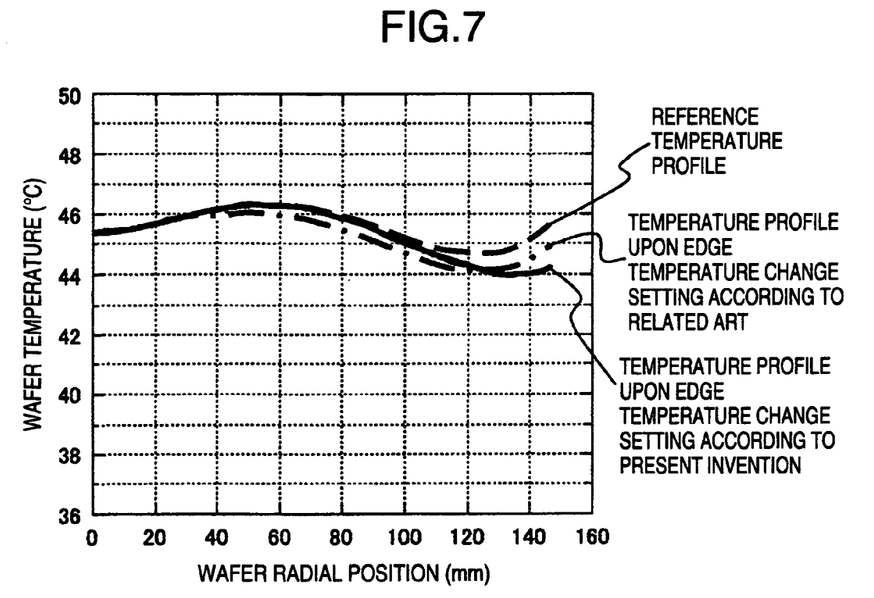
FIG. 7 is a graph showing distribution of the temperature of the wafer in the case where the wafer temperature has been adjusted by the sample stage (holder) having the electrode therein of the plasma processing apparatus according to each of the related art and the embodiment shown in FIG. 1.
Figure 8:
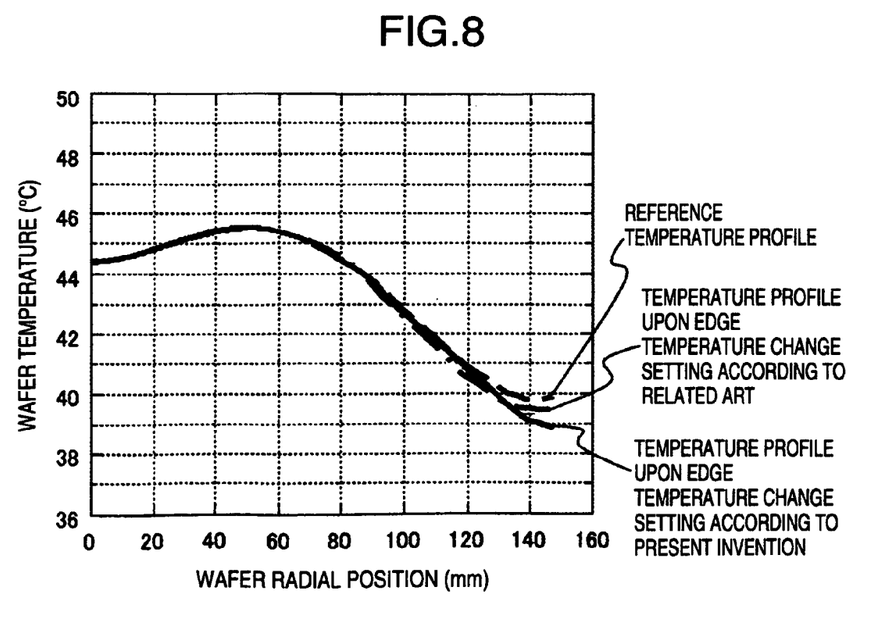
FIG. 8 is a graph showing distribution of the temperature of the wafer in the case where the wafer temperature has been adjusted by the sample stage (holder) having the electrode therein of the plasma processing apparatus according to each of the related art and the embodiment shown in FIG. 1.

Further, examples in which the invention has been executed for the purpose of improving the precision of the temperature control will be described with reference to FIGS. 7 and 8. FIGS. 7 and 8 show distribution of the temperature in the radial direction of the wafer 104 in the case where the temperature adjustment in the related art has been executed and distribution of the temperature in the radial direction in the case where the temperature control according to the embodiment has been executed. In those examples, by presuming that the etching shape difference in the radial direction of the wafer 104 is uniformed by finely adjusting the wafer temperature, the temperature control is set by decreasing the temperature of the edge region by 1° C. from the set temperature value serving as a predetermined reference.

FIG. 7 is a graph showing the distribution of the temperature obtained in the case where the temperature distribution of the wafer has been adjusted serving as a reference is flat. This diagram shows the distribution of the temperature in the radial direction of the wafer 104 in the case where the set temperature of the edge region 213 has been reduced by 1° C. in each of the case where the signals outputted from the temperature sensors are directly inputted as PV values of the PID controllers, the outputs from the heater power sources are adjusted, and the operation of the heaters is adjusted without using the foregoing arithmetic operations according to the embodiment and the case where the operation of the heaters is adjusted by using the foregoing arithmetic operations according to the embodiment. In the former case, it has been found that in spite of the fact that only the set temperature of the edge region 213 has been changed, the temperature of the middle region 212 also changed and the temperature of the edge region 213 was reduced only about 0.2° C. This is because a heat flow is caused from the middle region 212 to the edge region 213 due to the temperature difference. Thus, such an object that the working shape difference due to the etching is reduced and the shape is uniformed in the wafer inplane direction is not sufficiently accomplished. In the case of the latter embodiment, only the temperature near the edge region 213 has been decreased by about 1° C. as expected, the dimensional difference of the etching shape in the wafer inplane direction lies within a desired range, and the dimensional uniformity can be improved.

Subsequently, FIG. 8 shows the distribution of the temperature in the radial direction of the wafer in the case where the set temperature of the edge region 213 has been decreased by 1° C. in a manner similar to the above case when the temperature distribution serving as a reference has a convex shape around the center region 211 (middle high temperature distribution). Also in this case, when the foregoing arithmetic operations according to the embodiment are used, in a manner similar to the case where the reference temperature distribution shown in FIG. 7 is flat, a desired change in temperature distribution can be obtained, the dimensions of the etching shape are finely adjusted, and the working precision can be improved in the inplane direction of the surface of the wafer 104.

Figure 9:
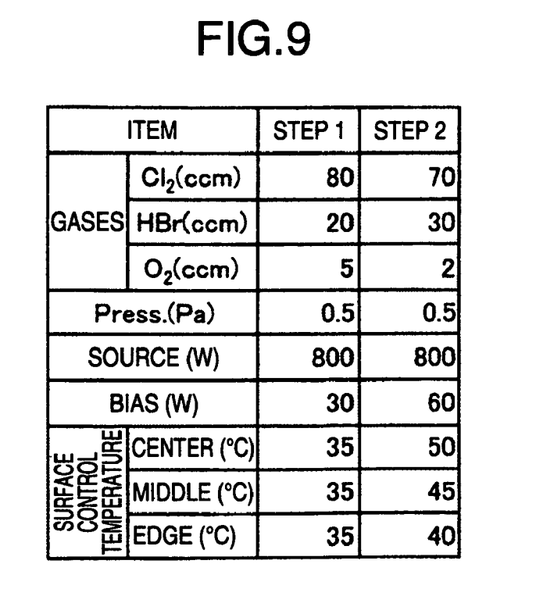
FIG. 9 is a table showing a recipe for an etching process constructed by two continuous steps which are executed by a plasma etching apparatus according to the embodiment shown in FIG. 1.

Subsequently, comparison results indicative of effects which are obtained in the case where the wafer temperature is directly adjusted and the other case will be described with reference to FIGS. 9 and 10. FIG. 9 is a table showing a recipe for an etching process constructed by two continuous steps which are executed by the plasma etching apparatus according to the embodiment shown in FIG. 1. In this etching process, the compositions of the process gas which is supplied between steps 1 and 2 of the recipe and the bias electric field are changed, and the settings of the temperatures of the center region 211, middle region 212, and edge region 213 are sequentially changed from 30/30/30 (° C.) to 45/41/36 (° C.). Those settings may be performed from a setting device provided for the plasma processing apparatus or from a display device which can input the detection values of the sensors and instructions and an input device for inputting the instructions to the etching processing apparatus. In those examples, the temperature adjustment of the wafer 104 is made so that the wafer temperature obtained in the case of adjusting the operation of the heaters on the basis of the value obtained by presuming it by arithmetically operating the temperature of the wafer 104 by using the outputs from the temperature sensors 205, 206, and 207 and the wafer temperature obtained in the stable state are equalized.

Figure 10:
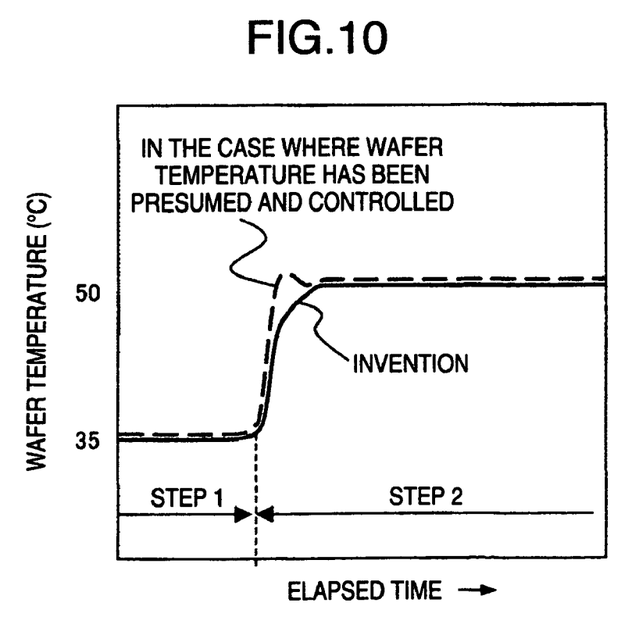
FIG. 10 is a graph showing a change in wafer temperature in the case where the wafer has been processed in accordance with the recipe for the etching process shown in FIG. 9 by the sample stage (holder) having the electrode therein of the plasma processing apparatus according to each of the related art and the embodiment shown in FIG. 1.

FIG. 10 shows a change in wafer temperature between the steps in the case where the operation of the heaters has been adjusted by using the wafer temperature and a change in the wafer temperature obtained in the case where the operation of the heaters has been adjusted by using the arithmetic operations regarding the embodiment. When the process advances from step 1 to step 2, in the case of the embodiment, a time which is necessary until the temperature reaches the saturation temperature is delayed as compared with case where the operation of the head plate 201 including the heater resistors 203 has been adjusted by using the temperature of the wafer 104. This result occurs since an amount of insertion heat from the plasma to the wafer 104 is not fed back into the temperature control unit 110. The shapes of the results obtained by etching-working the actual wafer in each of those two cases are compared, so that there is no difference of precision of the shapes.

Although the heater has been arranged in each of the center, middle, and edge regions for temperature adjustment of the dielectric material film of the sample stage surface of the sample stage 105 in the embodiment, the invention is not limited to those three regions. Similar functions and effects can be also obtained in the sample stage 105 having a plurality of temperature adjusting regions. Materials of the members which are used for the sample stage 105 are not limited to those shown in the foregoing embodiment. For example, titanium or its alloy may be used as a cooling plate 202 of the sample stage 105. As a material of the insulative film of the head plate 201, an oxide material of yttrium, a mixture of ceramics containing the oxide material, or their sintered materials may be used.

Although the temperature control unit 110 has been divided into a plurality of blocks and shown in FIGS. 3 and 4, some of the portions corresponding to those blocks may be built in arbitrary semiconductor devices. One semiconductor device may be a control unit which functions as one temperature control unit 110 containing each functional portion. The temperature control unit 110 having a network in which those blocks are arranged at remote positions and those blocks can communicate by a communicating apparatus may be constructed.

As shown in the foregoing embodiment, according to the embodiment, the temperature value of the precise and high speed wafer and its distribution can be realized, the yield and throughput are improved, and the production costs of the semiconductor device can be reduced.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for processing a sample located on a sample stage disposed inside a processing room arranged in a vacuum chamber using a plasma,
wherein the sample stage comprises:
a film which is composed of an insulative material, the film constituting a surface on which said sample is located;
a disk-shaped member which is made of a heat conductive material, wherein a lower portion of the film is disposed on an upper surface of the disk-shaped member;
a plurality of heaters disposed inside said film which are arranged in a first region which is ring-shaped and disposed in an outer peripheral side of said film and in a second region which is disposed in a central side of the first region next thereto;
a plurality of coolant channels which are arranged in said disk-shaped member and in which a coolant for cooling said disk-shaped member flows;

a plurality of temperature sensors which are respectively disposed at a lower portion of each of the first and second regions between said upper surface of said disk-shaped member and said coolant channels, the plurality of temperature sensors configured to detect temperatures of lower portions of said disk-shaped member corresponding to the respective first and second regions; and a plurality of power sources each of which outputs and adjusts an electric power to each of the heaters disposed in the first and second regions, and the processing method comprising steps of:

(i) positioning the sample onto the upper surface of the sample stage;

(ii) generating a plasma inside the processing room; and (iii) adjusting at least one output from one of said power sources by using a result obtained by estimating a temperature of the upper surface of the disk-shaped member while processing the sample, wherein step (iii) includes substeps of:

(a) obtaining an addition value Y1 of a value obtained by multiplying a sum of outputs from the plurality of temperature sensors by a first predetermined coefficient and a value obtained by multiplying a sum of outputs of the plurality of power sources by a second predetermined coefficient;

(b) obtaining an addition value Y2 of a value obtained by multiplying a difference between outputs from the plurality of temperature sensors by a third predetermined coefficient and a value obtained by multiplying a difference between outputs of the plurality of power sources by a fourth predetermined coefficient; and (c) adjusting a supply of the output from the power source for the heater corresponding to the first region based upon a difference between a set temperature of the portion in the first region of the disk-shaped member and the presumed present value of the temperature of the first region which is obtained from a difference value between Y1 and Y2; and (d) adjusting a supply of the output from the power source for the heater corresponding to the second region based upon a difference between the set temperature of the portion in the second region of the disk-shaped member and the presumed present value of the temperature of the second region which is obtained from an addition value of the Y1 and Y2.

\* \* \* \* \*